(12) United States Patent
Kim et al.

(10) Patent No.: US 7,188,281 B2
(45) Date of Patent: Mar. 6, 2007

(54) ERROR CORRECTION CODING APPARATUS AND METHOD

(75) Inventors: Ki-hyun Kim, Seongnam-si (KR); In-sik Park, Suwon-si (KR); Jae-seong Shim, Seoul (KR); Sung-hyu Han, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 422 days.

(21) Appl. No.: 10/680,419

(22) Filed: Oct. 8, 2003

(65) Prior Publication Data

US 2004/0168112 A1    Aug. 26, 2004

(30) Foreign Application Priority Data

Oct. 15, 2002    (KR)    ............. 10-2002-0062692

(51) Int. Cl.
- G06K 5/04 (2006.01)
- G11B 20/20 (2006.01)
- G11B 5/00 (2006.01)
- G06F 11/00 (2006.01)
- H03M 13/00 (2006.01)

(52) U.S. Cl. .............. 714/700; 714/801; 714/804; 714/755

(58) Field of Classification Search ............. None
See application file for complete search history.

(56) References Cited

U.S. PATENT DOCUMENTS 6,944,803 B2 *   9/2005   Hunt ................... 714/701

(Continued)

FOREIGN PATENT DOCUMENTS

WO    01/97387 A1    12/2001
WO    WO 01/97387    12/2001

OTHER PUBLICATIONS

McGowan, J.A., et al., "Loop Removal From LDPC Codes", Proc. IEEE Information Theory Workshop, ITW 2003, Paris, France, Mar. 31, 2003, pp. 230-233, XP010647444.

(Continued)

*Primary Examiner*—Phung My Chung
(74) *Attorney, Agent, or Firm*—Stein, McEwen & Bui, LLP

(57) ABSTRACT

An error correction coding apparatus includes a parity check matrix generation unit which generates a parity check matrix having a number of elements having a value of 1 in each row thereof, having a predetermined number of elements having a value of 1 in each column thereof, and having the other elements having a value of 0; a parity check matrix adjustment unit which receives the parity check matrix from the parity check matrix generation unit, searches the parity check matrix for a cycle forming group of four elements positioned at respective vertexes of a rectangle and having a value of 1, and when there is at least one cycle forming group, replaces the value of 1 of at least one element of the cycle forming group with the value 0 of another element, to output a adjusted parity check matrix without a cycle forming group therein; and an LDPC coding unit which receives the adjusted parity check matrix from the parity check matrix adjustment unit and receives an m-bit message word to perform LDPC coding.

23 Claims, 6 Drawing Sheets

U.S. PATENT DOCUMENTS

2002/0042899 A1* 4/2002 Tzannes et al. ............. 714/786
2003/0037298 A1 2/2003 Eleftheriou et al.
2005/0229088 A1* 10/2005 Tzannes et al. ............. 714/800

OTHER PUBLICATIONS

Matsumoto, W. et al., "Irregular low-density parity check code design based on Euclidean geometries", IEICE Transactions on Fundamentals of Electronics, Communications and Computer Sciences, Institute of Electronics Information and Comm. Eng. Tokyo, JP, vol. E86-A, No. 7, Jul. 2003, pp. 1820-1834, XP001174812 ISSN: 0916-8508.

Mackay, D. J. C.,: "Good error-correcting codes based on very sparse matrices" IEEE Transactions on Information Theory, IEEE Inc. New York, US, vol. 45, No. 2, Mar. 1999, pp. 399-431, XP002143042 ISSN: 0018-9448.
Davey, M. C., et al., "Low density parity check codes over GF(q)", Proc. IEEE Information Theory Workshop, ITW 1998, Killarney, Ireland, Jun. 22-26, 1998, pp. 70-71, XP010297325 ISBN: 0-7803-4408-1
European Search Report dated Sep. 30, 2004.
Office Action issued in Japanese Patent Application No. 2003-352528 on Oct. 4, 2005.
Office Action issued on May 19, 2006, in Chinese Patent Application No. 200310120939.3 (in Chinese with English translation).

* cited by examiner

FIG. 2A $$\begin{Bmatrix} \cdot & \cdot & \cdot & \cdot & \cdot & \cdot \\ \cdot & 0 & 0 & ① & ① & \cdot \\ \cdot & 0 & 0 & ① & ① & \cdot \\ \cdot & \boxed{1} & \boxed{1} & 0 & 0 & \cdot \\ \cdot & \boxed{1} & \boxed{1} & 0 & 0 & \cdot \\ \cdot & \cdot & \cdot & \cdot & \cdot & \cdot \end{Bmatrix}$$

FIG. 2B $$\begin{Bmatrix} 0 & 0 & ① & ① \\ 0 & 0 & ① & ① \\ \boxed{1} & \boxed{1} & 0 & 0 \\ \boxed{1} & \boxed{1} & 0 & 0 \end{Bmatrix}$$

FIG. 2C $$\begin{Bmatrix} \boxed{1} & 0 & 0 & ① \\ 0 & 0 & ① & ① \\ 0 & \boxed{1} & ① & 0 \\ \boxed{1} & \boxed{1} & 0 & 0 \end{Bmatrix}$$

FIG. 2D $$\begin{Bmatrix} 0 & 0 & ①　 & ① \\ ☐1 & 0 & 0 & ① \\ 0 & ☐1 & ① & 0 \\ ☐1 & ☐1 & 0 & 0 \end{Bmatrix}$$

FIG. 3A $$\begin{Bmatrix} \cdot & \cdot & \cdot & \cdot & \cdot \\ \cdot & △1 & 0 & ☐1 & 0 & ☐1 & \cdot \\ \cdot & 0 & 0 & ☐1 & 0 & ☐1 & \cdot \\ \cdot & ① & ① & 0 & 0 & 0 & \cdot \\ \cdot & ① & ① & 0 & 0 & 0 & \cdot \\ & \cdot & \cdot & \cdot & \cdot & \cdot \end{Bmatrix}$$

FIG. 3B $$\begin{Bmatrix} △1 & 0 & ☐1 & 0 & ☐1 \\ 0 & 0 & ☐1 & 0 & ☐1 \\ ① & ① & 0 & 0 & 0 \\ ① & ① & 0 & 0 & 0 \end{Bmatrix}$$

ERROR CORRECTION CODING APPARATUS AND METHOD

CROSS-REFERENCE TO RELATED APPLICATIONS

This application claims the priority of Korean Patent Application No. 2002-62692, filed on Oct. 15, 2002, in the Korean Intellectual Property Office, the disclosure of which is incorporated herein in its entirety by reference.

BACKGROUND OF THE INVENTION

1. Field of the Invention

The present invention relates to an error correction decoding apparatus and method, and more particularly, to a decoding apparatus and method which can improve decoding performance by adjusting elements of a parity check matrix when implementing a low density parity code (LDPC) decoding algorithm.

2. Description of the Related Art

A low density parity code (LDPC) encoding method is an error correction coding technique used in wireless communications and optical recording and/or reproducing fields. LDPC encoding includes a process for generating parity information (additional information) by using a parity check matrix in which the same number of elements whose values are 1 are included in each row and column and the values of other elements whose values are 0. A detailed description of the LDPC encoding is disclosed in an article entitled, "Good Error Correction Codes Based on Very Sparse Matrices" by D. J. MacKay, IEEE Trans. on Information Theory, vol. 45, No. 2, pp. 399–431, 1999.

When element values of two elements positioned on the same row among a parity check matrix whose values are 1, and elements having element value of 1 are positioned on each column where the two elements are positioned, a cycle-4 status results. FIGS. 2A and 3A show an example of a parity check matrix where such a cycle-4 status occurs twice. As shown in FIGS. 2A and 3A, each of the four elements whose element values are indicated by ○ and □, generate a cycle-4 status. In other words, in the cycle-4 status, four vertexes of a rectangle are formed by four elements having element value 1.

Generation of parity information using a parity check matrix where cycles exist may make decoding impossible or lower decoding performance.

A parity check matrix should satisfy two requirements: be linearly independent; and each predetermined number of elements whose values are 1 are included in each row and each column and the other elements whose values are 0. However, it is difficult to satisfy the two requirements and to remove cycles by generating a new parity check matrix or shifting locations of elements constituting a parity check matrix.

SUMMARY OF THE INVENTION

The present invention provides an LDPC coding apparatus and method which can satisfy requirements by a parity check matrix by shifting locations of elements generating cycles among elements constituting a parity check matrix and can enhance LDPC decoding performance by generating a parity check matrix from which cycles are removed.

Additional aspects and/or advantages of the invention will be set forth in part in the description which follows and, in part, will be obvious from the description, or may be learned by practice of the invention.

In accordance with an aspect of the present invention, there is provided an error correction coding apparatus including: a parity check matrix generation unit which generates a parity check matrix having a number of elements having a value of 1 in each row thereof, having a predetermined number of elements having a value of 1 in each column thereof, and having the other elements having a value of 0; a parity check matrix adjustment unit which receives the parity check matrix from the parity check matrix generation unit, searches the parity check matrix for a cycle forming group of four elements positioned at respective vertexes of a rectangle and having a value of 1, and when there is at least one cycle forming group, replaces the value of 1 of at least one element of the cycle forming group with the value 0 of another element, to output an adjusted parity check matrix without a cycle forming group therein; and an LDPC coding unit which receives the adjusted parity check matrix from the parity check matrix adjustment unit and receives an m-bit message word to perform LDPC coding.

In accordance with another aspect of the present invention, there is provided an error correction coding method including: generating a parity check matrix having a number of elements having a value of 1 in each row thereof, having a number of elements having a value of 1 in each column thereof, and having the other elements having a value of 0; receiving the parity check matrix, searching the parity check matrix for a cycle forming group of four elements positioned at the respective vertexes of a rectangle and having a value of 1, and when there is at least one cycle forming group, replacing the value of 1 of at least one element of the cycle forming group with the value 0 of another element, to output a adjusted parity check matrix without a cycle forming group therein; and receiving the modified parity check matrix and receiving an m-bit message word to perform LDPC coding.

According to yet another aspect of the present invention, there is provided a computer readable medium encoded with processing instructions for performing an error correction coding method including: generating a parity check matrix having a number of elements having a value of 1 in each row thereof, having a number of elements having a value of 1 in each column thereof, and having the other elements having a value of 0; receiving the parity check matrix, searching the parity check matrix for a cycle forming group of four elements, the four elements positioned at the respective vertexes of a rectangle and having a value of 1, and when there is at least one cycle forming group, replacing the value of 1 of at least one element of the cycle forming group with the value 0 of another element, to output a adjusted parity check matrix without a cycle forming group therein; and receiving the modified parity check matrix and receiving a m-bit message word to perform LDPC coding.

According to yet another aspect of the present invention, there is provided an error correction coding apparatus including: a parity check matrix generator which generates a parity check matrix, having one or more rows and one or more columns, a number of elements of first value in each row and each column and a number of elements of a second value; a parity check modifier which searches the parity check matrix for a cycle forming group of four elements positioned at each of the vertices of a rectangle and being of the first value and, when at least one cycle forming group is found, replaces the value of at least one element of each of the one ore more cycle forming groups with the second value, to output a modified parity check matrix without a cycle forming group therein; and a low density parity code (LDPC) coder which receives an m-bit message word to perform LDPC coding and performs LDPC coding using the adjusted parity check matrix.

According to yet another aspect of the present invention, there is provided a computer readable storage medium encoded with processing instructions for performing an error correction coding method including: generating a parity check matrix, having one or more rows and one or more columns, a number of elements of a first value in each row and each column and a number of elements of a second value; searching the parity check matrix for a cycle forming group of four elements positioned at each of the vertices of a rectangle and being of the first value and, when at least one cycle forming group is found, replaces the value of at least one element of each of the one or more cycle forming groups with the second value, to output a modified parity check matrix without a cycle forming group therein; and receiving an m-bit message word to perform low density parity code (LDPC) coding and performing LDPC coding using the adjusted parity check matrix.

BRIEF DESCRIPTION OF THE DRAWINGS

These and/or other aspects and advantages of the invention will become apparent and more readily appreciated from the following description of the preferred embodiments, taken in conjunction with the accompanying drawings of which:

FIGS. 2A through 2D show an example of a parity check matrix whose element values are adjusted by the parity check matrix adjustment unit shown in FIG. 1;

FIGS. 3A through 3D show a case where element values of elements constituting a cycle forming group 4 cannot be shifted;

DETAILED DESCRIPTION OF THE PREFERRED EMBODIMENTS

Figure 1:
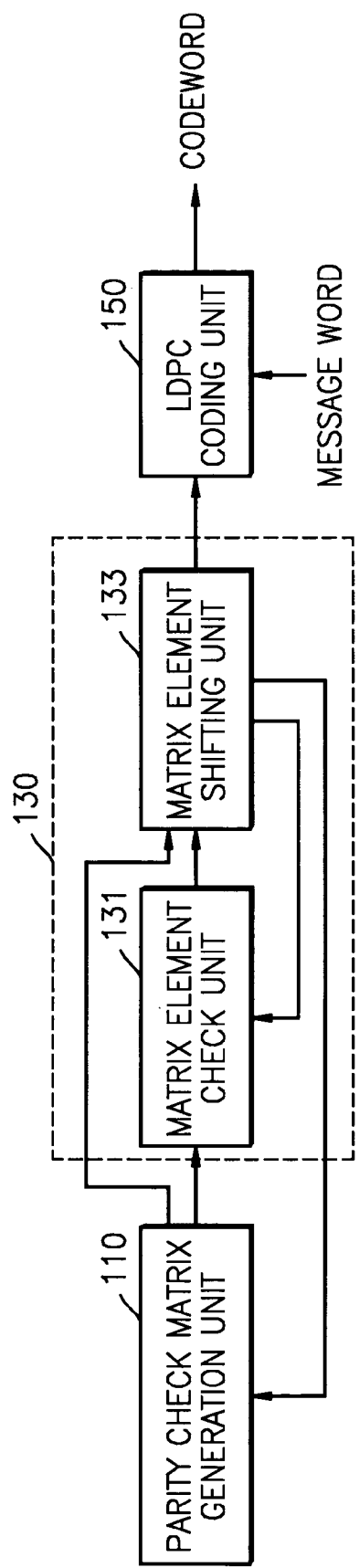
FIG. 1 is a block diagram illustrating an error correction coding apparatus according to an embodiment of the present invention.

Reference will now be made in detail to embodiments of the present invention, examples of which are illustrated in the accompanying drawings, wherein like reference numerals refer to the like elements throughout. The embodiments are described below in order to explain the present invention by referring to the figures.

FIGS. 1 through 3D illustrate an error correction coding apparatus according to an embodiment of the present invention.

FIG. 1 is a block diagram illustrating an error correction coding apparatus according to an embodiment of the present invention. Referring to FIG. 1, the error correction coding apparatus includes a parity check matrix generation unit 110, a parity check matrix adjustment unit 130 and a low density parity code (LDPC)/coding unit 150. The parity check matrix adjustment unit 130 includes a matrix element check unit 131 and a matrix element shifting unit 133.

The parity check matrix generation unit 110 generates a parity check matrix C (not shown) including a number of elements whose values are 1 in each row and a number of elements whose values are 1 in each column, and including other elements whose values are 0. The parity check matrix C is a p×c matrix where p is a value corresponding to the number of bits of parity information, and c is a value corresponding to the number of bits of a codeword and equals the sum of p and m, that is, p+m. Here, m is a value corresponding to the number of bits of a message word.

The parity check matrix C meets two requirements. That is to say, a column weight and a row weight should be kept constant in each row and each column. The column weight is the number of elements whose values are 1 included in each column, and the row weight is the number of elements whose values are 1 in each row.

The parity check matrix C is linearly independent. If linear independence is not met, matrix operation cannot be performed using the parity check matrix C during decoding.

For example, if p equals 100 and m equals 900, that is, c being equal to 1000, the parity check matrix C can be generated such that 3 elements whose values are 1 are included in each row, 30 elements whose values are 1 are included in each column, and the other elements are made to have a value 0. In this case, the parity check matrix C has a column weight of 3 and a row weight of 30. Here, the proportion of the column weight to the row weight is 1:10. However, it is to be understood that other proportions are possible The parity check matrix adjustment unit 130 receives the parity check matrix C from the parity check matrix generation unit 110 and searches for cycle forming groups each formed by four elements positioned at (w, x), (w, y), (z, x) and (z, y) and being 1 among elements of the parity check matrix C. As a result, if there is at least one cycle forming group, an adjusted parity check matrix H, that is, a parity check matrix without a cycle forming group, is generated by shifting at least one element having element value 1 to another element having element value 0.

In this embodiment, a cycle forming group is a set of elements constituting the parity check matrix C among elements of the parity check matrix C where four elements whose values are 1 form four vertexes of a rectangle.

FIGS. 2A through 2D illustrate the parity check matrix C whose element values are adjusted by the parity check matrix adjustment unit 130.

The matrix element check unit 131 (shown in FIG. 1) searches for a plurality of cycle forming groups existing in the parity check matrix C and outputs information on positions of elements constituting two cycle forming groups to the matrix element shifting unit 133.

Referring to FIG. 2A, four elements whose element values are indicated by ○ and □, generate a cycle-4 status. For ease of explanation, the four elements indicated by □ are defined as a first cycle forming group, and the other four elements indicated by ○ are defined as a second cycle forming group.

The matrix element check unit 131 outputs position information of the respective elements constituting the first cycle forming group, that is, (w1, x1), (w1, y1), (z1, x1) and (z1, y1), and position information of the respective elements constituting the second cycle forming group, that is, (w2, x2), (w2, y2), (z2, x2) and (z2, y2), to the matrix element shifting unit The matrix element shifting unit 133 receives the two pieces of position information of each four elements constituting the first and second cycle forming groups and shifts at least one element value, thereby removing the cycle forming groups from the parity check matrix C.

For a better understanding of the operation of the matrix element shifting unit 133, FIG. 2B illustrates a simplified parity check matrix C shown in FIG. 2A, the parity check matrix including the first cycle forming group, the second cycle forming group and surrounding element values, and having the other elements removed from the parity check matrix C.

FIGS. 2C and 2D show examples of the shift of elements constituting a cycle forming group in a simplified parity check matrix.

Referring to FIG. 2C, an element having element value 1 of the first cycle forming group is shifted from (1, 3) to (3, 3), and, of the two elements of the second cycle forming group existing on the third row to which the element of the first cycle forming group is shifted, the element positioned on (3, 1) is shifted to a first row where the first cycle forming group is originally positioned while maintaining the value of the column, that is, 1, thereby being shifted to (1, 1).

Referring to FIG. 2D, an element having element value 1 of the first cycle forming group is shifted from (2, 3) to (3, 3), and, of two elements of the second cycle forming group existing on the third row to which the element of the first cycle forming group is shifted, the element positioned on (3, 1) is shifted to (2, 1).

As shown in FIGS. 2C and 2D, two cycle forming groups are removed by shifting the elements whose values are 1 forming the respective cycle forming groups, and the two requirements by a parity check matrix are satisfied, thereby generating a new parity check matrix H.

According to this embodiment, elements having element value 1 of each cycle forming group are vertically shifted such that only the values of the rows are changed while the values of the columns are retained, thereby achieving the same effect as that achieved by horizontally shifting elements having element value 1 of each cycle forming group.

As described above, however, as elements having element value 1 are shifted, a new cycle forming group may be undesirably generated.

FIGS. 3A through 3D show a case where element values of elements constituting a cycle forming group 4 cannot be shifted.

FIG. 3A shows a parity check matrix C in which two groups of four elements indicated by ○ and □ each generate a cycle-4 status. The four elements indicated by □ belong to a first cycle forming group, and the other four elements indicated by ○ belong to a second cycle forming group. Elements having element value 1 that do not belong to either the first cycle forming group or the second cycle forming group are indicated by Δ.

FIG. 3B shows a simplified parity check matrix including the first and second cycle forming groups and surrounding element values in the parity check matrix C shown in FIG. 3A and excluding the other elements.

As described above, the matrix element shifting unit 133 shifts one element having element value 1 of the first cycle forming group shown in FIG. 3B to a row in which two elements having element value 1 of the second cycle forming group exist by changing the value of the row of the one element of the first cycle forming group while retaining the value of the column of the one element of the first cycle forming group. One element of the two elements having element value 1 of the second cycle forming group existing in the row to which the one element of the first cycle forming group was shifted is shifted to the row in which the one element of the first cycle forming group that was shifted originally existed.

Referring to FIG. 3B, the element having element value 1 of the second cycle forming group positioned at (1, 3), cannot be shifted to (1, 1) because an element having element value 1 already exists at (1, 1). The matrix element shifting unit 133 shifts an element having element value 1 of a cycle forming group to a desired position, or to another position at which there is no element having element value 1 if an element having element value 1already exists at the desired position. The matrix element shifting unit 133 shifts another element having element value 1 if there is no position at which there is no element having element value 1to which elements having element value 1 of a particular cycle forming group can be shifted.

Figure 3C:
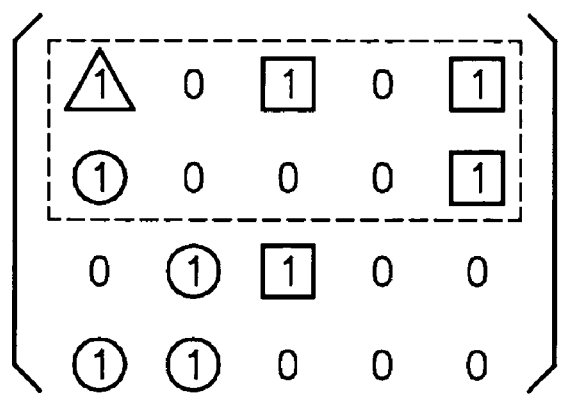

FIG. 3C shows a case in which the element having element value 1 of the first cycle forming group positioned at (2, 3) is shifted to (3, 3), and one element of the two elements having element value 1 of the second cycle forming group existing on row 3 to which the element of the first cycle forming group was shifted, that is, the element having element value 1 positioned at (3, 1), is shifted to (2, 1). This results in there being four elements having element value 1 forming four vertexes of a rectangle indicated by a dashed line, that is, the four elements having element value 1 positioned at (1, 1), (1, 5), (2, 1) and (2, 5), thereby generating a new cycle forming group. Therefore, the element having element value 1 of the first cycle forming group positioned at (2, 3) cannot be shifted to (3, 3).

Figure 3D:
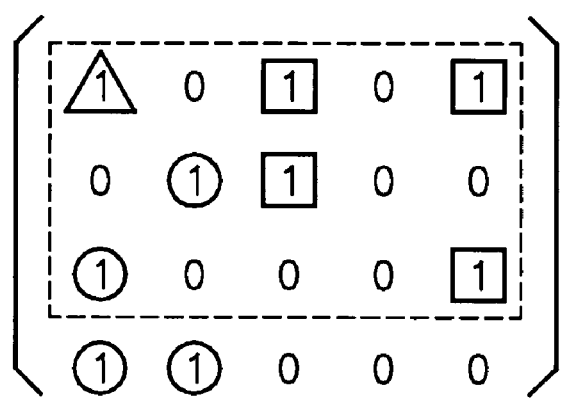

FIG. 3D shows a case in which the element having element value 1 of the first cycle forming group positioned at (2, 5) is shifted to (3, 5), and one element of the two elements having element value 1 of the second cycle forming group existing on 3 row to which the element of the first cycle forming group was shifted, that is, the element having element value 1 positioned at (3, 2), is shifted to (2, 2). This also results in there being four elements having element value 1 forming four vertexes of a rectangle indicated by a dashed line, that is, (the elements having element value 1 positioned at (1, 1), (1, 5), (3,1) and (3,5), thereby also generating a new cycle forming group. Therefore, the element having element value 1 of the first cycle forming group positioned at (2, 5) cannot be shifted to (3, 5).

In the parity check matrix where the cycle shown in FIG. 3B occurs, shifting of any element in the cycle forming group always generates a new cycle. In this case, the matrix element shifting unit 133 requests position information of a new pair of cycle forming groups from the matrix element check unit 131. The above-described operation is performed on the new pair of cycle forming groups, thereby removing two cycle forming groups.

The matrix element shifting unit 133 repeatedly performs the operations until all cycle forming groups are removed.

If all cycle forming groups are not removed or one cycle forming group is not removed, the matrix element shifting unit 133 transmits a signal requesting for generation of a new parity check matrix to the parity check matrix generation unit 110.

The LDPC coding unit 150 receives a parity check matrix H without a cycle forming group from the parity check matrix shifting unit 133 and receives a m-bit message word $k_i$ (i=1, 2. . . m), thereby performing LDPC coding.

The LDPC coding unit 150 determines a matrix X satisfying the following equation:

$$H \times X = 0$$

$$\text{wherein } X \text{ is an } (m+p) \times 1 \text{ matrix} \begin{pmatrix} k_1 \\ k_2 \\ \cdot \\ \cdot \\ \cdot \\ k_m \\ x_1 \\ x_2 \\ \cdot \\ \cdot \\ \cdot \\ x_p \end{pmatrix}.$$

Among the elements of the matrix X, $k_1, k_2, \ldots, k_m$ are the m bits of the m-bit message word $k_i$, and $x_1, x_2, \ldots, x_p$, which are p bits of parity information. Since the matrix H and $k_i$(i=1, 2 . . . m) of the matrix are known, the parity information $x_i$(i=1, 2 . . . p) of the matrix X can be determined using the equation.

The LDPC coding unit 150 outputs a codeword having parity information added to the message word and performs LDPC coding.

An error correction coding method according to an embodiment of the present invention will now be described with reference to FIGS. 1, 4 and 5.

Figure 4:
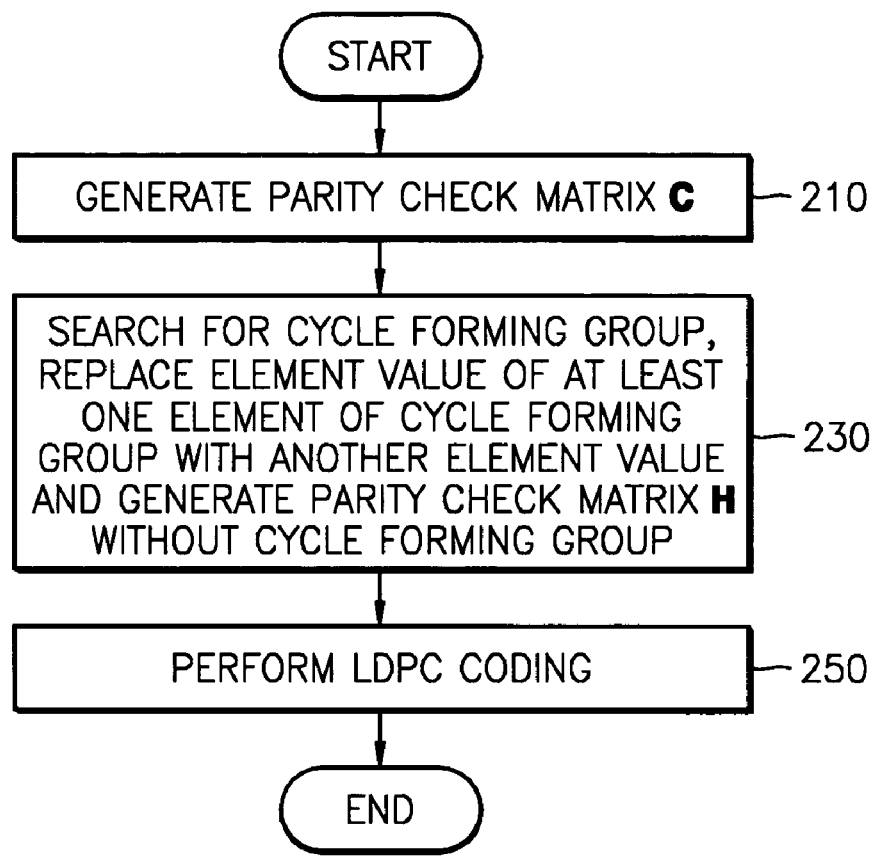
FIG. 4 is a flowchart illustrating an error correction coding method performed by the error correction coding apparatus of FIG. 1.

FIG. 4 is a flowchart illustrating an error correction coding method performed by the error correction coding apparatus according to the present invention shown in FIG. 1.

In operation 210, the parity check matrix generation unit 110 generates a parity check matrix C having a predetermined number of elements having element value 1 in each row, having a predetermined number of elements having element value 1 in each column and having the other elements having element value 0.

In operation 230, the parity check matrix adjustment unit 130 receives the parity check matrix C from the parity check matrix generation unit 110, searches for a plurality of cycle forming groups of four elements positioned at (w, x), (w, y), (z, x) and (z, y) among elements of the parity check matrix C and having element value 1, and if there is at least one cycle forming group, changes element value 1 of at least one element of the cycle forming group into element value 0 of another element to output a parity check matrix H without a cycle forming group.

In operation 250, the LDPC coding unit 150 receives the parity check matrix H without a cycle forming group from the parity check matrix shifting unit 133 and receives a m-bit message word $k_i$ (i=1, 2, . . . m) to perform LDPC coding.

Figure 5:
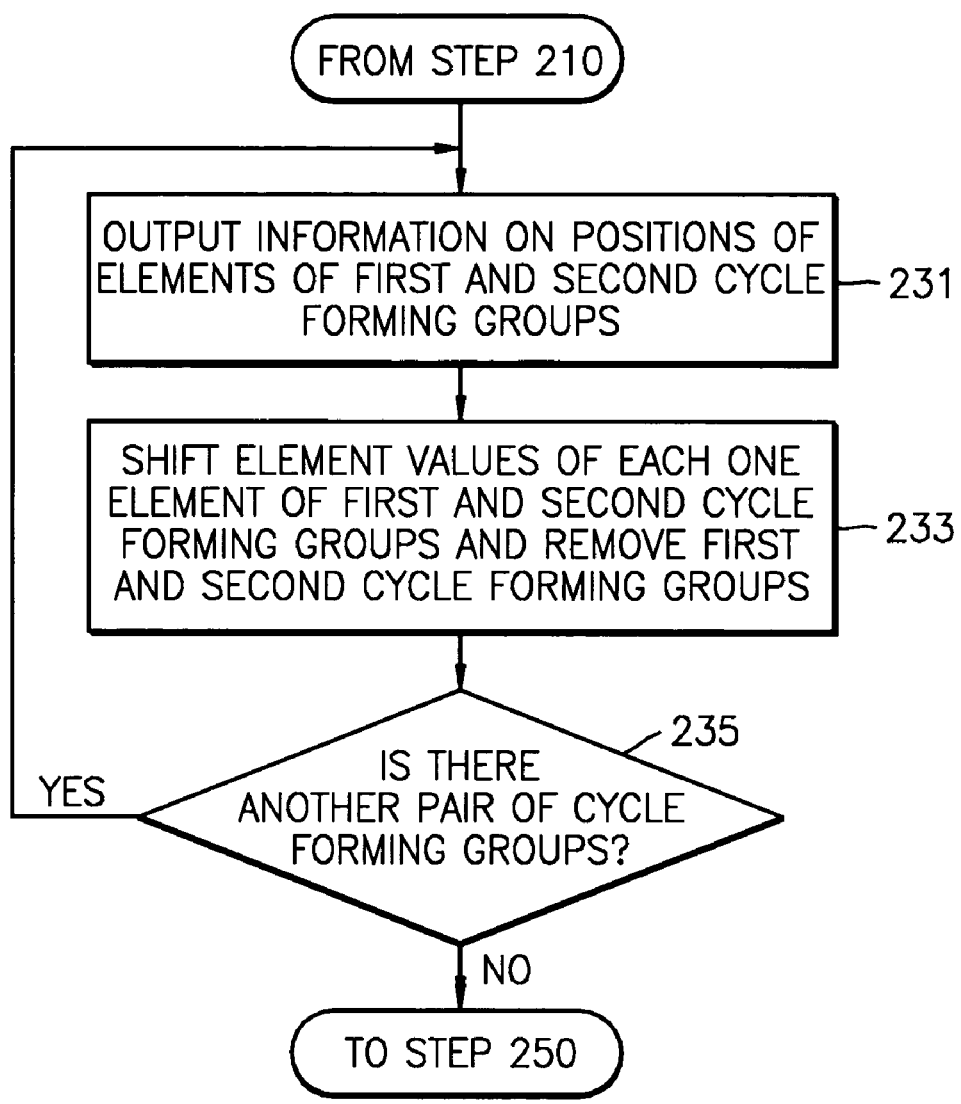
FIG. 5 is a flowchart showing suboperations of operation 230 of the method of FIG. 4.

FIG. 5 is a flowchart showing suboperations of operation 230 shown in FIG. 4.

In operation 231, the matrix element check unit 131 receives the parity check matrix C from the parity check matrix generation unit 110, searches for a plurality of cycle forming groups existing in the parity check matrix C and outputs information on positions of the respective elements of the first cycle forming group, that is, (w1, x1), (w1, y1), (z1, x1) and (z1, y1) a information on positions of the respective elements of the second cycle forming group, that is, (w2, x2), (w2, y2), (z2, x2) and (z2, y2) to the matrix element shifting unit 133.

In operation 233, the matrix element shifting unit 133 horizontally shifts one element $S_{ij}$ having element value 1 of the first cycle forming group (i=w1 or z1 and j=x1 or y1) to either (i x2) or (i, y2), and shifts one element $Q_{kl}$ having element value 1 of the second cycle forming group (k=w2 or z2 and l=x2 or y2) existing on a column to which $S_{ij}$ having element value 1 is shifted, to (k, j), thereby removing the first and second cycle forming groups. The matrix element shifting unit 133 shifts elements of a cycle forming group both horizontally and vertically, thereby achieving the same effect. In other words, one element $S_{ij}$ having element value 1 of the first cycle forming group (i=w1 or z1 and j=x1 or y1) is vertically shifted to either (w2, j) or (z2, j), and one element $Q_{kl}$ having element value 1 of the second cycle forming group (k=w2 or z2 and l=x2 or y2) existing on a column to which $S_{ij}$ having element value 1 is shifted, to (i, l), thereby removing the first and second cycle forming groups.

In operation 235, the matrix element shifting unit 133 repeatedly performs operations 231 through 233 until all cycle forming groups are removed.

The present invention may be embodied in a code, which can be read by a computer, on a computer readable recording medium. The computer readable recording medium includes all kinds of recording apparatuses on which computer readable data are stored. The computer readable recording media includes storage media such as magnetic storage media, e.g., ROM's, RAM's, CD-ROMs, magnetic tapes, floppy disks, optical data storage media, and carrier waves, e.g., transmissions over the Internet. Also, the computer readable recording media can be scattered on computer systems connected through a network and can store and execute a computer readable code in a distributed mode.

As described above, in the aforesaid embodiment of the present invention, elements constituting cycle forming groups existing in parity check matrix are appropriately shifted, thereby keeping a column weight and a row weight of the parity check matrix constant to satisfy linear independence and removing cycle forming groups causing deterioration in decoding performance from the parity check matrix to enhance LDPC decoding performance.

Although an embodiment of the present invention has been shown and described, the present invention is not limited to this embodiment. Rather, it would be appreciated by those skilled in the art that changes may be made in this embodiment without departing from the principles and spirit of the invention, the scope of which is defined by the claims and their equivalents.

What is claimed is:

1. An error correction coding apparatus comprising:
    a parity check matrix generation unit that generates a parity check matrix having elements arranged in rows and columns, with a number of the elements in each of the rows having a value of 1 and all of the other elements in the rows having a value of 0, and a number of the elements in each of the columns having a value of 1 and all of the other elements in the columns having a value of 0;
    a parity check matrix adjustment unit that
        receives the parity check matrix from the parity check matrix generation unit,
        searches the parity check matrix for a cycle forming group of four elements having a value of 1 respectively positioned at vertexes of a rectangle, and
        when a cycle forming group is found in the parity cheek matrix, generates an adjusted parity matrix without a cycle forming group therein by replacing the value of 1 of at least one element of the four elements of the cycle forming group with a value of 0, and replacing the value 0 of another element in the same row or the same column as the one element of the four elements with a value of 1; and a low-density parity-check (LDPC) coding unit that
receives the adjusted parity check matrix from the parity check matrix adjustment unit,
receives an m-bit message word, and
performs LDPC coding of the m-bit message word based on the adjusted parity check matrix.

2. The error correction coding apparatus of claim 1, wherein the parity check matrix adjustment unit comprises:
a matrix element check unit that
receives the parity check matrix from the parity check matrix generation unit,
searches the parity check matrix for a plurality of cycle forming groups, and
outputs position information on positions (w1, x1), (w1, y1), (z1, x1 ), and (z1, y1) in the parity check matrix of four elements having a value of 1 of a first cycle forming group found in the parity check matrix, and position information on positions (w2, x2), (w2, y2), (z2, x2), and (z2, y2) in the parity check matrix of four elements having a value of 1 of a second cycle forming group found in the parity check matrix, with $w_n$ and $z_n$ identifying rows of the parity check matrix and $x_n$ and $y_n$ identifying columns of the parity check matrix; and
a matrix element shifting unit that
receives the position information on the positions of the four elements of the first cycle forming group and the position information on the positions of the four elements of the second cycle forming group from the matrix element checking unit,
horizontally shifts one element $S_{ij}$ of the four elements having a value of 1 of the first cycle forming group, where i=w1 or z1 and j=x1 or y1, to a position of (i, x2) or (i, y2) in another column, and
horizontally shifts one element $Q_{kl}$ of the four elements having a value of 1 of the second cycle forming group located in the same column to which the one element $S_{ij}$ was shifted, where k=w2 or z2 and l=x2 or y2, to a position of (k, j) in the same column from which the one element $S_{ij}$ was shifted, thereby removing the first cycle forming group and the second cycle forming group from the parity check matrix;
wherein, when two other cycle forming groups are found in the parity check matrix, the parity check matrix adjustment unit removes the two other cycle forming groups to generate the adjusted parity check matrix without a cycle forming group therein.

3. The error correction coding apparatus of claim 2, wherein the matrix element shifting unit horizontally shifts the one element $S_{ij}$ to a position of (i, x2) if an element already existing at a position of (i, y2) has a value of 1 or horizontally shifts the one element $S_{ij}$ a position of (i, y2) if an element already existing at a position of (i, x2) has a value of 1.

4. The error correction coding apparatus of claim 2, wherein if elements already existing at positions of (i, x2) and (i, y2) have a value of 1 for i of the one element $S_{ij}$, matrix element shifting unit selects a different one of the four elements having a value of 1 of the first cycle forming group, having a different value of i as a different element $S_{ij}$ horizontally shifts the different element $S_{ij}$ to a position of (i, x2) if an element already existing at a position of (i, y2) has a value of 1, or horizontally shifts the different element $S_{ij}$ to a position of (i, y2) if an element already existing at a position of (i, x2) has a value of 1.

5. The error correction coding apparatus of claim 2, wherein the matrix element shifting unit horizontally shifts the one element $S_{ij}$ to a position of (i, x2) if horizontally shifting the one element $S_{ij}$ to a position of (i, y2) would create a new cycle forming group, or horizontally shifts the one element $S_{ij}$ to a position of (i, y2) if horizontally shifting the one element $S_{ij}$ to a position of (i, x2) would create a new cycle forming group.

6. The error correction coding apparatus of claim 2, wherein if horizontally shifting the one element $S_{ij}$ to a position of (i, x2) for i of the one element $S_{ij}$ would create a new cycle forming group, and horizontally shifting the one element $S_{ij}$ to a position of (i, y2) for i of the one element $S_{ij}$ would also create a new cycle forming group, the matrix element shifting unit selects a different one of the four elements having a value of 1 of the first cycle forming group the having a different value of i as a different element $S_{ij}$, horizontally shifts the different element $S_{ij}$ to a position of (i, x2) if horizontally shifting the different element $S_{ij}$ to a position of (i, y2) would create a new cycle forming group, or horizontally shifts the different element $S_{ij}$ to a position of (i, y2) if horizontally shifting the different element $S_{ij}$ to a position of (i, x2) would create a new cycle forming group.

7. The error correction coding apparatus of claim 2, wherein if the matrix element shifting unit is unable to remove the first cycle forming group and the second cycle forming group from the parity check matrix, the matrix element shifting unit requests the matrix element check unit position to output position information for two other cycle forming groups to be removed by the matrix element shifting unit.

8. The error correction coding apparatus of claim 2, wherein if the parity check matrix adjustment unit is unable to remove all cycle forming groups from the parity check matrix, the matrix element shifting unit requests the parity check matrix generation unit to generate a new parity check matrix to be input to the matrix element check unit.

9. The error correction coding apparatus of claim 1, wherein the parity check matrix adjustment unit comprises:
a matrix element check unit that
receives the parity check matrix from the parity check matrix generation unit,
searches the parity check matrix for a plurality of cycle forming groups, and
outputs position information on positions (w1, x1), (w1, y1), (z1, x1) and (z1, y1) in the parity check matrix of four elements having a value of 1 of a first cycle forming group found in the parity check matrix, and position information on positions (w2, x2), (w2, y2), (z2, x2) and (z2, y2) in the parity check matrix of four elements having a value of 1 of second cycle forming group found in the parity check matrix, with $w_n$ and $z_n$ identifying rows of the parity check matrix and $x_n$ and $y_n$ identifying columns of the parity check matrix; and
a matrix element shifting unit that
receives the position information on the positions of the four elements of the first cycle forming group and the position information on the positions of the four elements of the second cycle forming group from the matrix element checking unit,
vertically shifts one element $S_{ij}$ of the four elements having a value of 1 of the first cycle forming group, where i=w1 or z1 and j=x1 or y1, to a position of (w2, j) or (z2, j) in another row, and vertically shifts one element $Q_{kl}$ of the four elements having a value of 1 of the second cycle forming group located in the same row to which the one element $S_{ij}$ was shifted, where k=w2 or z2 and l=x2 or y2, to a position of (i, l) in the same row from which the one element $S_{ij}$ was shifted, thereby removing the first cycle forming group and the second cycle forming group from the parity check matrix;

wherein, when two other cycle forming groups are found in the parity check matrix, the parity check matrix adjustment unit removes the two other cycle forming groups to generate the adjusted parity check matrix without a cycle forming group therein.

10. The error correction coding apparatus of claim 1, wherein the adjusted parity check matrix is a matrix H;

wherein the m-bit message word is denoted by $k_j$ (i=1, 2, . . . m);

wherein the LDPC coding unit determines p bits of parity information $x_i$ (i=1, 2, . . . p) that are elements of a matrix X satisfying the following equation:

$$H \times X = 0, \text{ where } X \text{ is an } (m+p) \times 1 \text{ matrix} \begin{pmatrix} k_1 \\ k_2 \\ \cdot \\ \cdot \\ \cdot \\ k_m \\ x_1 \\ x_2 \\ \cdot \\ \cdot \\ \cdot \\ x_p \end{pmatrix}; \text{ and}$$

wherein the LDPC coding unit outputs a codeword having the parity information $x_i$ (i=1, 2 . . . p ) added to the m-bit message word $k_i$ (i=1, 2, . . . m).

11. An error correction coding method comprising:

generating a parity check matrix having elements arranged in rows and columns with a parity check matrix generation unit, with a number of the elements in each of the rows having a value of 1 and all of the other elements in the rows having value of 0, and a number of the elements in each of the columns having a value of 1 and all of the other elements in the columns having a value of 0;

searching the parity check matrix for a cycle forming group of four elements having a value of 1 respectively positioned at vertexes of a rectangle;

when a cycle forming group is found in the parity check matrix, generating an adjusted parity check matrix without a cycle forming group therein with a parity check matrix adjustment unit; and by replacing the value of 1 of at least one element of the four elements of the cycle forming group with a value of 0, and replacing the value 0 of another element in the same row or the same column as the one element of the four elements with a value of 1; and performing low-density parity-check (LDPC) coding of an m-bit message word based on the adjusted parity check matrix with an LDPC coding unit.

12. The error correction coding method of claim 11, wherein the searching of the parity check matrix comprises:

searching the parity check matrix for a plurality of cycle forming groups, and obtaining position information on positions (w1, x1), (w1, y1), (z1, x1) and (z1, y1) in the parity check matrix of four elements having a value of 1 of a first cycle forming group found in the parity check matrix, and position information on positions (w2, x2), (w2, y2), (z2, x2) and (z2, y2) in the parity check matrix of four elements having a value of 1 of a second cycle forming group found in the parity check matrix, with $w_n$ and $z_n$ identifying rows of the parity check matrix and $x_n$ and $y_n$ identifying columns of the parity check matrix;

wherein the generating of the adjusted parity check matrix comprises horizontally shifting one element $S_{ij}$ of the four elements having a value of 1 of the first cycle forming group, where i=w1 or z1 and j=x1 or y1, to a position of (i, x2) or (i, y2) in another column, and horizontally shifting one element $Q_{kl}$ of the four elements having a value of 1 of the second cycle forming group located in the same column to which the one element $S_{ij}$ was shifted, where k=w2 or z2 and l=x2 or y2, to a position of (k, j) in the same column from which the one element $S_{ij}$ was shifted, thereby removing the first cycle forming group and the second cycle forming group from the parity check matrix; and when two other cycle forming groups are found in the parity check matrix, repeating the generating of the adjusted parity check matrix to remove the two other cycle forming groups from the parity check matrix.

13. The error correction coding method of claim 12, wherein the horizontally shifting of the one element $S_{ij}$ comprises horizontally shifting the one element $S_{ij}$ to a position of (i, x2) if an element already existing at a position of (i, y2) has a value of 1, or horizontally shifting the one element $S_{ij}$ a position of (i, y2) if an element already existing at a position of (i, x2) has a value of 1.

14. The error correction coding method of claim 12, wherein if elements already existing at positions (i, x2) and (i, y2) have a value of 1 for i of the one element $S_{ij}$, the horizontally shifting of the one element $S_{ij}$ comprises selecting a different one of the four elements having a value of 1 of the first cycle forming group having a different value of i as a different element $S_{ij}$, horizontally shifting the different element $S_{ij}$ to a position of (i, x2) if an element already existing at a position of (i, y2) has a value of 1, or horizontally shifting the different element $S_{ij}$ to a position of (i, y2) if an element already existing at a position of (i, x2) has a value of 1.

15. The error correction coding method of claim 12, wherein the horizontally shifting of the one element $S_{ij}$ comprises horizontally shifting the one element $S_{ij}$ to a position of (i, x2) if horizontally shifting the one element $S_{ij}$ to a position of (i, y2) would create a new cycle forming group, or horizontally shifting the one element $S_{ij}$ to a position of (i, y2) if horizontally shifting the one element $S_{ij}$ to a position of (i, x2) would create a new cycle forming group.

16. The error correction coding method of claim 12, wherein if horizontally shifting the one element $S_{ij}$ to a position of (i, x2) for i of the one element $S_{ij}$ would create a new cycle forming group, and horizontally shifting the one element $S_{ij}$ to a position of (i, y2) for i of the one element $S_{ij}$ would also create a new cycle forming group, the horizontally shifting of the one element $S_{ij}$ comprises selecting a different one of the four elements having a value of 1 of the first cycle forming group having a different value of i as a different element $S_{ij}$, horizontally shifting the different element $S_{ij}$ to a position of (i, x2) if horizontally shifting the different element $S_{ij}$ to a position of (i, y2) would create a new cycle forming group, or horizontally shifting the different element $S_{ij}$ to a position of (i, y2) if horizontally shifting the different element $S_{ij}$ to a position of (i, x2) would create a new cycle forming group.

17. The error correction coding method of claim 12, wherein if the first cycle forming group and the second cycle forming group cannot be removed in the generating of the adjusted parity check matrix, the searching of the parity check matrix further comprises obtaining position information for two other cycle forming groups to be removed in the generating of the adjusted parity check matrix.

18. The error correction coding method of claim 12, wherein if all cycle forming groups cannot be removed from the parity check matrix in the generating of the adjusted parity check matrix, the generating of the adjusted parity check matrix further comprises requesting generation of a new parity check matrix to be searched in the searching of the parity check matrix.

19. The error correction coding method of claim 11, wherein the searching of the parity check matrix comprises:
   searching the parity check matrix for a plurality of cycle forming groups, and
   outputting position information on positions (w1, x1), (w1, y1), (z1, x1), and (z1, y1) in the parity check matrix of four elements having a value of 1 of a first cycle forming group found in the parity check matrix, and position information on positions (w2, x2), (w2, y2), (z2, x2), and (z2, y2) in the parity check matrix of four elements having a value of 1 of a second cycle forming group, found in the parity check matrix, with $w_n$ and $z_n$ identifying rows of the parity check matrix and $x_n$ and $y_n$ identifying columns of the parity check matrix;
   wherein the generating of the adjusted parity check matrix comprises
      vertically shifting one element $S_{ij}$ of the four elements having a value of 1 of the first cycle forming group, where i=w1 or z1 and j=x1 or y1, to a position of (w2, j) or (z2, j) in another row, and
      vertically shifting one element $Q_{kl}$ of the four elements having a value of 1 of the second cycle forming group located in the same row to which the one element $S_{ij}$ was shifted, where k=w2 or z2 and l=x2 or y2, to a position of (i, l) in the same row from which the one element $S_{ij}$ was shifted, thereby removing the first cycle forming group and the second cycle forming group from the parity check; and
   when two other cycle forming groups are found in the parity check matrix, repeating the generating of the adjusted parity check matrix to remove the two other cycle forming groups from the parity check matrix.

20. The error correction coding method of claim 11, wherein the adjusted parity check matrix is a matrix H;
   wherein the m-bit message word is denoted by $k_i$ (i=1, 2, ... m);
   wherein the performing of the LDPC coding comprises determining p bits of parity information $x_1$ (i=1, 2 ... p) that are elements of a matrix X satisfying the following equation:

$$H \times X = 0, \text{ where } X \text{ is an } (m+p) \times 1 \text{ matrix} \begin{pmatrix} k_1 \\ k_2 \\ \cdot \\ \cdot \\ \cdot \\ k_m \\ x_1 \\ x_2 \\ \cdot \\ \cdot \\ \cdot \\ x_p \end{pmatrix}; \text{ and}$$

wherein the performing of the LDPC coding further comprises generating a codeword having the parity information $x_i$ (i=1, 2 ... p) added to the m-bit message word $k_i$ (i=1, 2, ... m).

21. A computer readable medium encoded with processing instructions for performing an error correction coding method comprising:
   generating a parity check matrix having elements arranged in rows and columns, with a number of the elements in each of the rows having a value of 1 and all of the other elements in the rows having a value of 0, and a number of the elements in each of the columns having a value of 1 and all of the other elements in the columns having a value of 0;
   searching the parity check matrix for a cycle forming group of four elements having a value of 1 respectively positioned at vertexes of a rectangles;
   when a cycle forming group is found in the parity check matrix, replacing the value of 1 of at least one element of the four elements of the cycle forming group with a value of 0, and replacing the value 0 of another element in the same row or the same column as the one element of the four elements with a value of 1 to generate an adjusted parity check matrix without a cycle forming group therein; and
   performing low-density parity-check (LDPC) coding of an m-bit message word based on the adjusted parity check matrix.

22. An error correction coding apparatus comprising:
   a parity check matrix generator generates a parity check matrix having elements arranged in rows and columns, with a number of the elements in each of the rows having a first value and all of the other elements in the rows having a second value different from the first value, and a number of the elements in each of the columns having the first value and all of the other elements in the columns having the second value;
   a parity check matrix modifier that
      receives the parity check matrix from the parity check matrix generator,
      searches the parity check matrix for a cycle forming group of four elements having the first value respectively positioned at vertexes of a rectangle, and
      when a cycle forming group is found in the parity check matrix, replaces the first value of at least one element of the four elements of the cycle forming group with the second value, and replaces the second value of another element in the same row or the same column as the one element of the four elements with the first value to generate a modified parity check matrix without a cycle forming group therein; and low-density parity-cheek (LDPC) coder that
  receives the modified parity check matrix from the parity check matrix modifier,
  receives an m-bit message word, and
  performs LDPC coding of the m-bit message word based on the modified parity check matrix.

23. A computer readable medium encoded with processing instructions for performing an error correction coding method comprising:

generating a parity check matrix having elements arranged in rows and columns, with a number of the elements in each of the rows having a first value and all of the other elements in the rows having a second value different from the first value, and a number of the elements in each of the columns having the first value and all of the other elements in the columns having the second value;

searching the parity check matrix for a cycle forming group of four elements having the first value respectively positioned at vertexes of a rectangle; and when a cycle forming group is found in the parity check matrix, replacing the first value of at least one element of the four elements of the cycle forming group with the second value, and replacing the second value of another element in the same row or the same column as the one element of the four elements with the first value to generate a modified parity check matrix without a cycle forming group therein; and p1 performing low-density parity-check (LDPC) coding of an m-bit message word based on the modified parity check matrix.

* * * * *

UNITED STATES PATENT AND TRADEMARK OFFICE
CERTIFICATE OF CORRECTION

PATENT NO. : 7,188,281 B2
APPLICATION NO. : 10/680419
DATED : March 6, 2007
INVENTOR(S) : Ki-hyun Kim et al.

It is certified that error appears in the above-identified patent and that said Letters Patent is hereby corrected as shown below:

Column 8, line 63, change "cheek" to --check--

Column 9, line 55, insert a comma after "1"

Column 9, line 56, insert --to-- after "$S_{ij}$"

Column 9, line 62, insert --the-- before "matrix"

Column 9, line 64, insert a comma after "$S_{ij}$"

Column 10, line 19, delete "the"

Column 11, line 17, change "$k_j$" to --$k_i$--

Column 11, line 57, delete "; and"

Column 12, line 38, insert --to-- after "$S_{ij}$"

Column 13, line 35, delete comma

Column 13, line 52, insert --matrix-- after "check"

Column 14, line 34, change "rectangles" to --rectangle--

Column 14, line 47, insert --that-- after "generator"

Column 15, line 3, change "cheek" to --check--

Column 16, line 14, start new paragraph after "and"

UNITED STATES PATENT AND TRADEMARK OFFICE
CERTIFICATE OF CORRECTION

PATENT NO. : 7,188,281 B2
APPLICATION NO. : 10/680419
DATED : March 6, 2007
INVENTOR(S) : Ki-hyun Kim et al.

It is certified that error appears in the above-identified patent and that said Letters Patent is hereby corrected as shown below:

Column 16, line 14, delete "p1"

Signed and Sealed this

Twenty-sixth Day of June, 2007

JON W. DUDAS
*Director of the United States Patent and Trademark Office*